US011754612B2

(12) United States Patent
Ding et al.

(10) Patent No.: US 11,754,612 B2
(45) Date of Patent: Sep. 12, 2023

(54) DISTRIBUTION TRANSFORMER LOCALIZATION AND MONITORING USING DISTRIBUTED FIBER OPTIC SENSING

(71) Applicant: NEC Laboratories America, Inc., Princeton, NJ (US)

(72) Inventors: Yangmin Ding, East Brunswick, NJ (US); Sarper Ozharar, Princeton, NJ (US); Yue Tian, Princeton, NJ (US); Ting Wang, West Windsor, NJ (US)

(73) Assignee: NEC Corporation

( * ) Notice: Subject to any disclaimer, the term of this patent is extended or adjusted under 35 U.S.C. 154(b) by 0 days.

(21) Appl. No.: 17/719,322

(22) Filed: Apr. 12, 2022

(65) Prior Publication Data
US 2022/0334165 A1   Oct. 20, 2022

Related U.S. Application Data

(60) Provisional application No. 63/174,726, filed on Apr. 14, 2021.

(51) Int. Cl.
*G01R 31/08*   (2020.01)
*G01H 9/00*   (2006.01)

(52) U.S. Cl.
CPC .......... *G01R 31/085* (2013.01); *G01H 9/004* (2013.01)

(58) Field of Classification Search
CPC ...... G01R 31/085; G01H 9/004; G01H 9/006; G01L 1/246; G01L 1/242; H01S 3/0675; G01D 5/35316
See application file for complete search history.

(56) References Cited

U.S. PATENT DOCUMENTS

| | | | |
|---|---|---|---|
| 10,175,286 B1* | 1/2019 | Reilley | G01R 31/085 |
| 2017/0011612 A1* | 1/2017 | Jain | G08B 21/182 |
| 2019/0113561 A1* | 4/2019 | Yogeeswaran | G02B 6/483 |
| 2021/0123797 A1* | 4/2021 | Kiesel | G01M 3/047 |

* cited by examiner

*Primary Examiner* — Son T Le
*Assistant Examiner* — Brian Butler Geiss
(74) *Attorney, Agent, or Firm* — Joseph Kolodka (57) ABSTRACT

Distributed fiber optic sensing (DFOS) systems and methods for monitoring electrical power distribution transformers and locating failing/failed/malfunctioning transformers from humming signals indicative of a transformer's operational integrity and are advantageously detected/analyzed via DFOS mechanisms.

7 Claims, 8 Drawing Sheets

| Transformer Condition | Vibration Pattern | |
|---|---|---|
| | Time Domain | Frequency Domain |
| New transformer (up to 2 years) | The energy of the vibration is distributed along the time axis uniformly. | doesn't contain any higher harmonic frequency (>600Hz) components |
| More than 10 years | The stationarity of the vibration signal is worse | Higher harmonic frequency appears |
| Deformed windings | The stationarity of the vibration signal is poor | Higher harmonic frequency appears |
| Influence of geomagnetic field | - | Generate frequency at 60 Hz and its harmonics |
| Mechanical properties | - | Shape of the FRF and resonance frequency change |
| Reduction of stiffness in winding assembly | - | Overall increase in the vibration response |
| Winding clamping looseness | - | General decrease of natural frequencies |
| Oil pumps/transformer cooling fans vibration | - | Frequencies below 100 Hz |
| Vibration of small elements not related to fixation quality of the core or winding | - | Frequencies above 1000 Hz |

DISTRIBUTION TRANSFORMER LOCALIZATION AND MONITORING USING DISTRIBUTED FIBER OPTIC SENSING

CROSS REFERENCE TO RELATED APPLICATIONS

This application claims the benefit of United States Provisional Patent Application Ser. No. 63/174,726 filed 14 Apr. 2021 the entire contents of each is incorporated by reference as if set forth at length herein.

TECHNICAL FIELD

This disclosure relates generally to distributed fiber optic sensing (DFOS) systems methods and structures. More particularly, it describes DFOS systems and methods for locating and monitoring of electrical power distribution transformers.

BACKGROUND

As those skilled in the art will readily appreciate, distributed fiber optic sensing systems and methods have shown to be of great utility and provide a range of useful services such as sensing various physical parameters including temperature, vibration, strain, etc., thereby enabling a new era of infrastructure monitoring.

Utility poles are well known and recognizable in contemporary society and are typically associated with suspending telecommunications, electrical power, and other infrastructure facilities including distribution transformers. As is known, when distribution transformers fail, electrical power service interruptions occur which sometimes involve fires and resulting hazards. Given their importance to contemporary society, a convenient method to monitor electrical power distribution transformers and quickly locate failing/failed electrical power distribution transformers would represent a welcome addition to the art.

SUMMARY

An advance in the art is made according to aspects of the present disclosure directed to DFOS systems and methods for monitoring electrical power distribution transformers and locating failing/failed/malfunctioning transformers from humming signals indicative of a transformer's operational integrity and are advantageously detected/analyzed via DFOS mechanisms.

BRIEF DESCRIPTION OF THE DRAWING

A more complete understanding of the present disclosure may be realized by reference to the accompanying drawing in which.

The illustrative embodiments are described more fully by the Figures and detailed description. Embodiments according to this disclosure may, however, be embodied in various forms and are not limited to specific or illustrative embodiments described in the drawing and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGs comprising the drawing are not drawn to scale.

By way of some additional background, we note that distributed fiber optic sensing systems interconnect optoelectronic integrators to an optical fiber (or cable), converting the fiber to an array of sensors distributed along the length of the fiber. In effect, the fiber becomes a sensor, while the interrogator generates/injects laser light energy into the fiber and senses/detects events along the fiber length.

As those skilled in the art will understand and appreciate, DFOS technology can be deployed to continuously monitor vehicle movement, human traffic, excavating activity, seismic activity, temperatures, structural integrity, liquid and gas leaks, and many other conditions and activities. It is used around the world to monitor power stations, telecom networks, railways, roads, bridges, international borders, critical infrastructure, terrestrial and subsea power and pipelines, and downhole applications in oil, gas, and enhanced geothermal electricity generation. Advantageously, distributed fiber optic sensing is not constrained by line of sight or remote power access and—depending on system configuration—can be deployed in continuous lengths exceeding 30 miles with sensing/detection at every point along its length. As such, cost per sensing point over great distances typically cannot be matched by competing technologies.

Fiber optic sensing measures changes in "backscattering" of light occurring in an optical sensing fiber when the sensing fiber encounters vibration, strain, or temperature change events. As noted, the sensing fiber serves as sensor over its entire length, delivering real time information on physical/environmental surroundings, and fiber integrity/security. Furthermore, distributed fiber optic sensing data pinpoints a precise location of events and conditions occurring at or near the sensing fiber.

Figure 1:
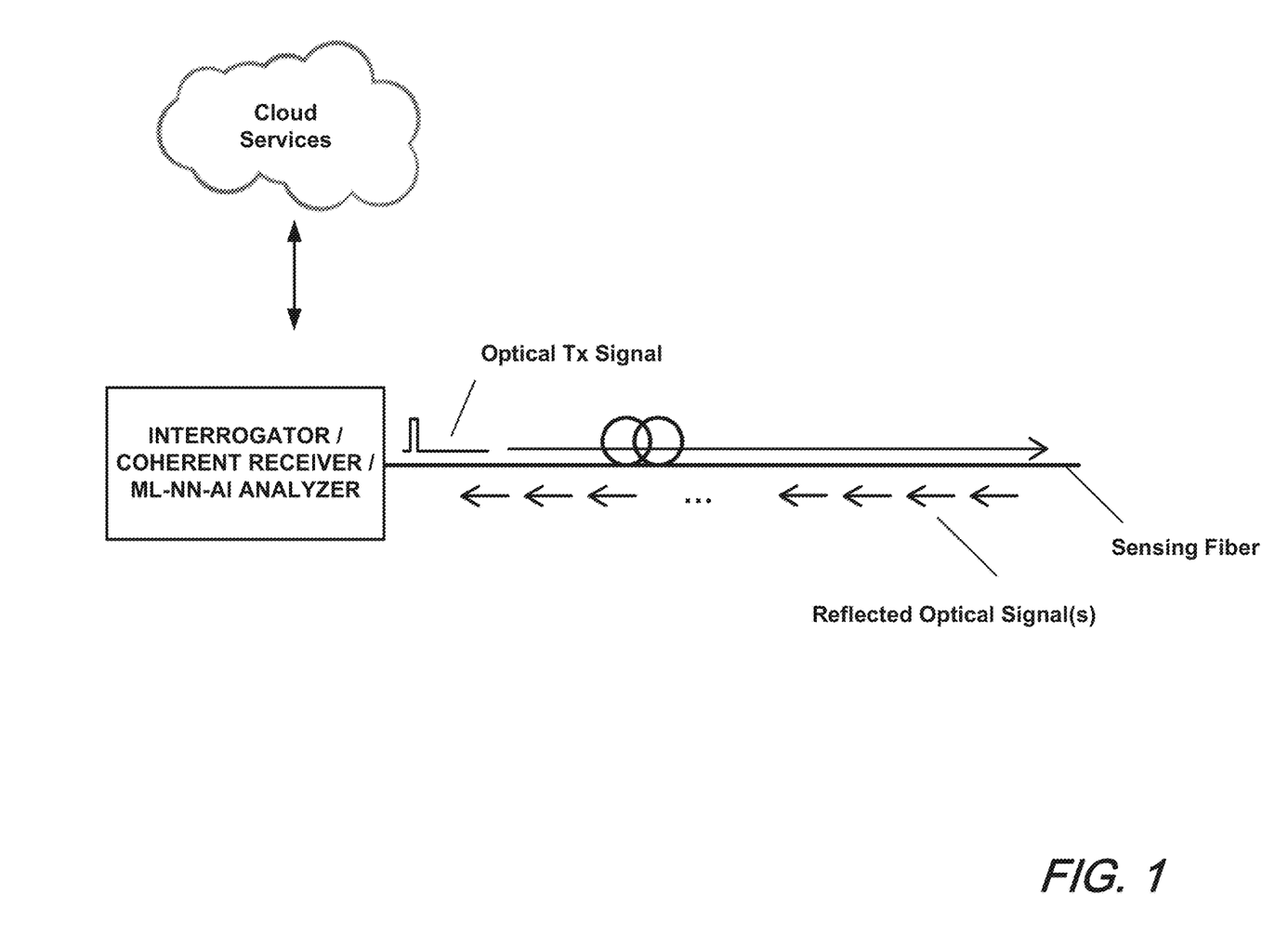
FIG. 1 is a schematic diagram of an illustrative distributed fiber optic sensing system according to aspects of the present disclosure.

A schematic diagram illustrating the generalized arrangement and operation of a distributed fiber optic sensing system including artificial intelligence analysis and cloud storage/service is shown in FIG. 1. With reference to FIG. 1 one may observe an optical sensing fiber that in turn is connected to an interrogator. As is known, contemporary interrogators are systems that generate an input signal to the fiber and detects/analyzes reflected/scattered and subsequently received signal(s). The signals are analyzed, and an output is generated which is indicative of the environmental conditions encountered along the length of the fiber. The signal(s) so received may result from reflections in the fiber, such as Raman backscattering, Rayleigh backscattering, and Brillion backscattering. It can also be a signal of forward direction that uses the speed difference of multiple modes. Without losing generality, the following description assumes reflected signal though the same approaches can be applied to forwarded signal as well.

As will be appreciated, a contemporary DFOS system includes the interrogator that periodically generates optical pulses (or any coded signal) and injects them into an optical fiber. The injected optical pulse signal is conveyed along the optical fiber.

At locations along the length of the fiber, a small portion of signal is scattered/reflected and conveyed back to the interrogator. The scattered/reflected signal carries information the interrogator uses to detect, such as a power level change that indicates—for example—a mechanical vibration.

The reflected signal is converted to electrical domain and processed inside the interrogator. Based on the pulse injection time and the time signal is detected, the interrogator determines at which location along the fiber the signal is coming from, thus able to sense the activity of each location along the fiber.

Distributed Acoustic Sensing (DAS)/Distributed Vibrational Sensing (DVS) systems detect vibrations and capture acoustic energy along the length of optical sensing fiber. Advantageously, existing; traffic carrying fiber optic networks may be utilized and turned into a distributed acoustic sensor, capturing real-time data. Classification algorithms may be further used to detect and locate events such as leaks, cable faults, intrusion activities, or other abnormal events including both acoustic and/or vibrational.

Various DAS/DVS technologies are presently used with the most common being based on Coherent Optical Time Domain Reflectometry (C-OTDR). C-OTDR utilizes Rayleigh back-scattering, allowing acoustic frequency signals to be detected over long distances. An interrogator sends a coherent laser pulse along the length of an optical sensor fiber (cable). Scattering sites within the fiber cause the fiber to act as a distributed interferometer with a gauge length like that of the pulse length (e.g. 10 meters). Acoustic disturbance acting on the sensor fiber generates microscopic elongation or compression of the fiber (micro-strain), which causes a change in the phase relation and/or amplitude of the light pulses traversing therein.

Before a next laser pulse is be transmitted, a previous pulse must have had time to travel the full length of the sensing fiber and for its scattering/reflections to return. Hence the maximum pulse rate is determined by the length of the fiber. Therefore, acoustic signals can be measured that vary at frequencies up to the Nyquist frequency, which is typically half of the pulse rate. As higher frequencies are attenuated very quickly, most of the relevant ones to detect and classify events are in the lower of the 2 kHz range.

Figure 2:
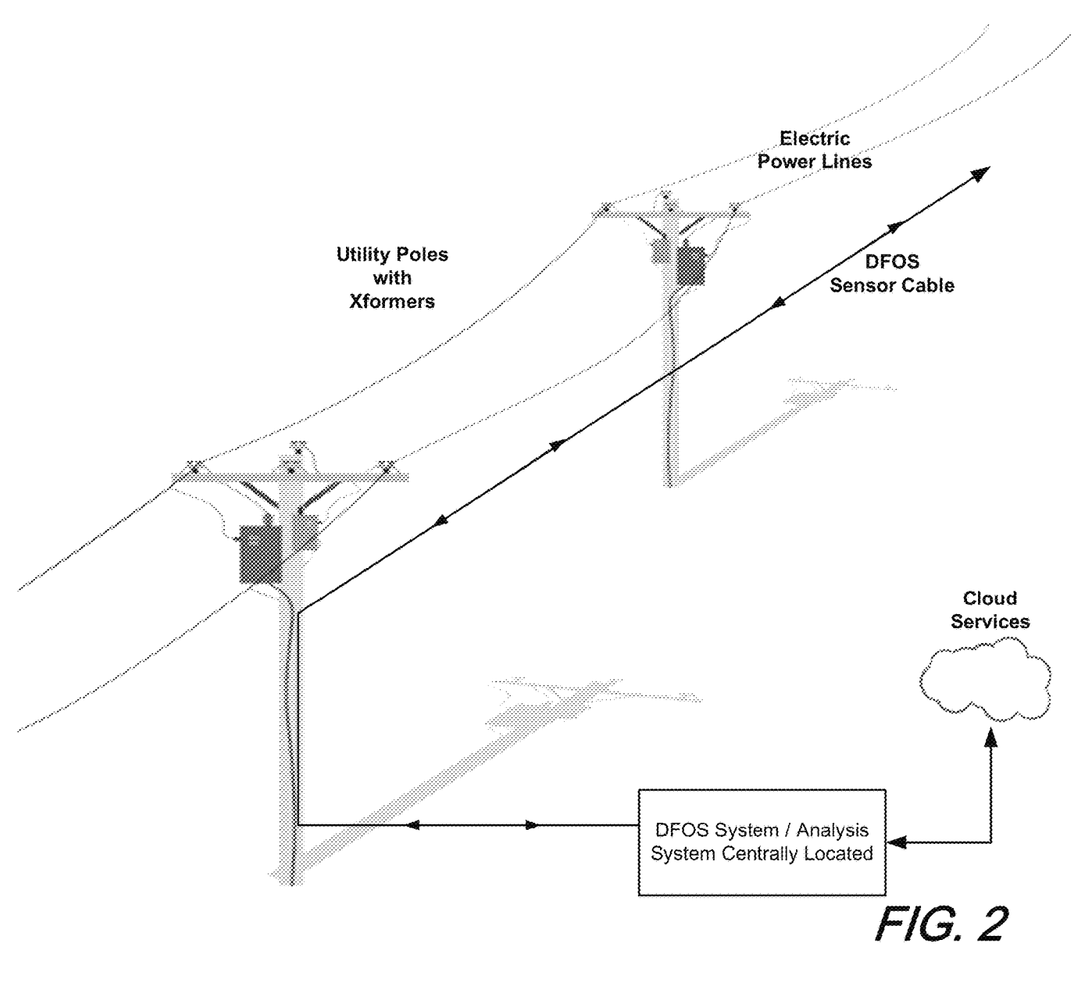
FIG. 2 is a schematic diagram illustrating a series of utility poles suspending a DFOS sensor fiber (telecommunications fiber/cable) and electrical power distribution transformer according to aspects of the present disclosure.
Figure 3:
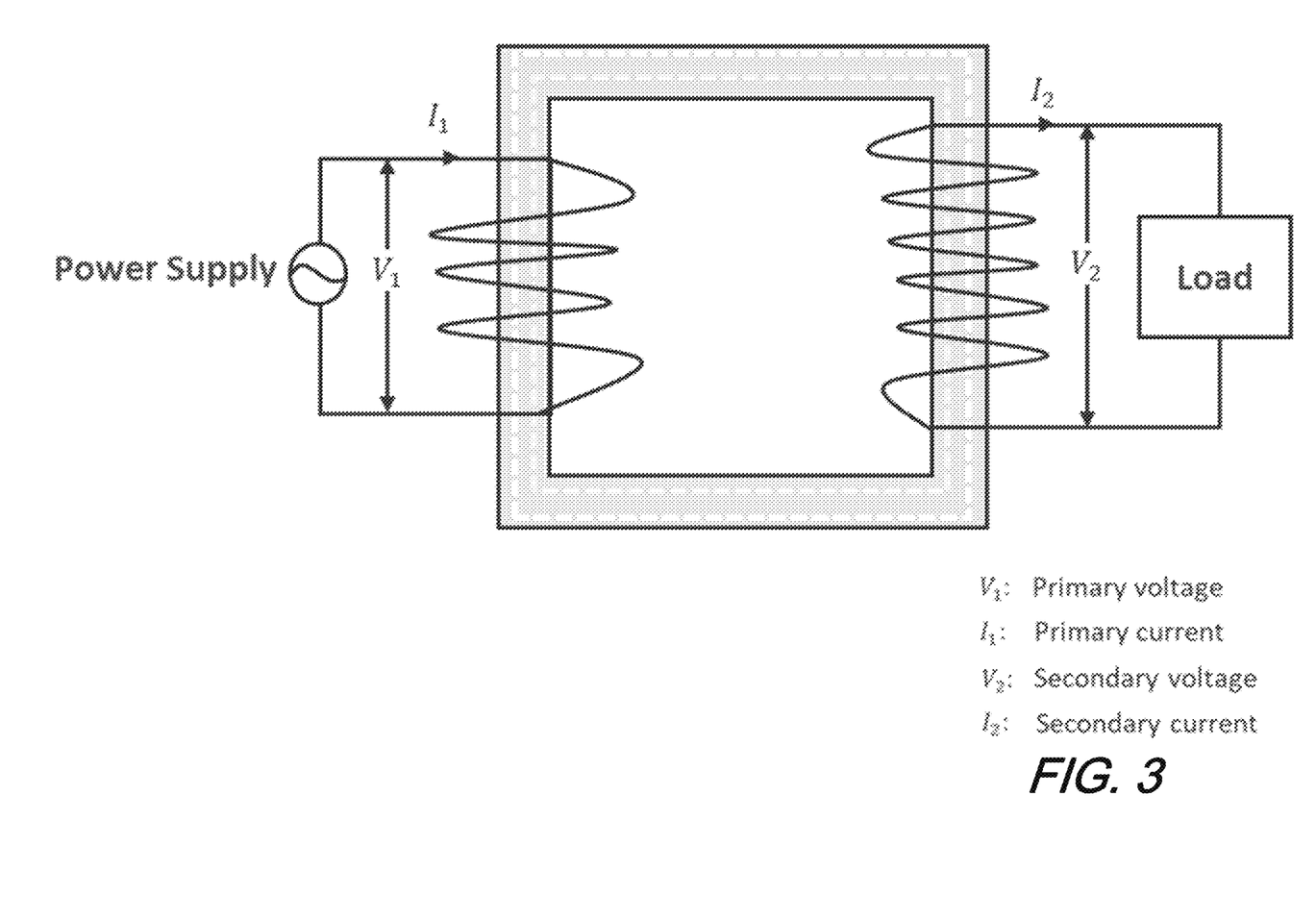
FIG. 3 is a schematic diagram illustrating working principles of an electrical power distribution transformer according to aspects of the present disclosure.

FIG. 2 is a schematic diagram illustrating wires/cables aerially suspended/supported by a utility pole according to aspects of the present disclosure. As may be observed from that figure, utility poles generally include aerial telecommunications cables, which includes may telephone and cable TV wires/cables, electrical power lines and associated electrical power distribution transformers.

As is known, a distributed fiber optic sensing system allows existing telecommunication fiber optic cable to be employed as a distributed sensor to capture responses of the optical cable resulting from mechanical vibrations. In this disclosure, we employ DFOS systems and methods to detect baseline/anomalous vibrations in electrical power distribution transformers and determine failing/failed transformers that may occur before a catastrophic failure such as an explosion/fire and resulting hazards.

As will be appreciated by those skilled in the art, an electrical power distribution transformer is a passive device that can be used to step up or step-down voltages. A basic transformer includes two sets of windings, a primary winding that connects to a power source, and a secondary winding which connects to a load—usually at a lower voltage. A resulting magnetic field in a transformer is continuously changing as an alternating current (AC) changes its polarity and magnitude. Additionally, since the core of the transformer is made of iron and laminates, the iron core changes its shape when the change in magnetic flux occurs.

This change in the shape of the transformer core creates a vibration which eventually leads to a noise/sound, i.e., "humming." The humming noise in a transformer depends on the frequency of the AC supply. Generally, the frequency of the humming sound is twice the operating supply of power frequency. For example, in the US, the operating power frequency is 60 Hz which will result in a humming frequency of 120 Hz.

The humming sound also depends on the core lamination. When the lamination is not properly performed or otherwise defective the transformer creates more humming noise, thus a loose clamping and/or poor stacking increases the humming. Those skilled in the art will also understand and appreciate that transformer loading also affects the humming sound. More particularly, if a transformer is supplying a large load (for example, during nighttime, more power supply is demanded) it will conduct a large current. Such large current results in a greater magnetic flux that further increases the humming.

Figure 4:
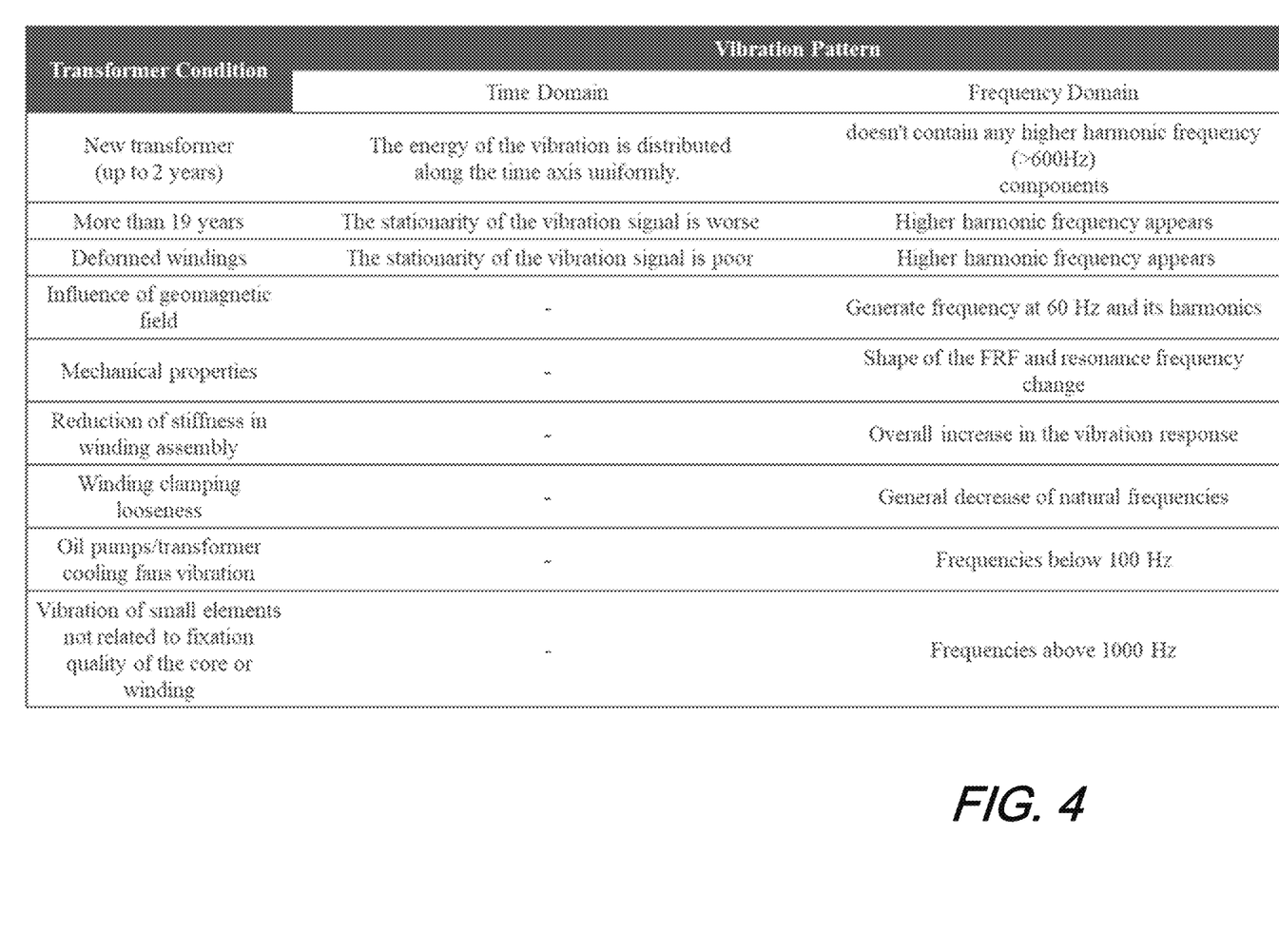
FIG. 4 is a diagram illustrating transformer condition(s) and associated vibration pattern(s) according to aspects of the present disclosure.

Studies have shown that electrical power distribution transformer humming frequency having integer harmonics can be linked to transformers conditions shown as presented in FIG. 4, which is a diagram illustrating transformer condition(s) and associated vibration pattern(s) according to aspects of the present disclosure.

For example, a newer transformer does not produce harmonic frequencies above 600 Hz, however, as the transformer ages, a higher harmonics frequency appears. Under current practice however, a non-working transformer status is mainly reported by end-user customers such as a homeowner or pedestrians. There is no existing technology that continuously monitors the integrity and conditions of a transformer before it ends its service life and structural deterioration occurs.

Such monitoring is even more difficult as there are typically too many transformers to be monitored along a same route since and inspecting individual transformers is a time-consuming/labor-intensive task. Accordingly, a continuous monitoring system and method according to the present disclosure advantageously saves time, capital expenditure(s), and maintenance time as well as reducing Therefore employment of a continuous monitoring method can save time and capital expenditures as well as reducing the errors involved with collecting data on the large number of transformers in a particular power distribution route.

Accordingly, systems and methods according to aspects of the present disclosure provide continuous monitoring of electrical power distribution transformers using distributed fiber optic sensing and signal processing techniques. As noted, harmonics and integer harmonics of a distribution transformer may be associated with the integrity of a transformer, and by detecting/monitoring/evaluating an abnormal humming sound or harmonics, we advantageously monitor the status of the transformers.

According to aspects of the present disclosure, a distributed fiber optic sensing interrogator utilizes existing telecommunication optical fiber/cable as a distributed sensor, which enables real-time continuous data collection/monitoring and transfer without necessitating the installation of any extra sensor(s). Once DFOS data is collected/by a DFOS interrogator/analyzer and locally stored of stored to a cloud database, various signal processing techniques are employed for data analysis, which enables automatic transformer signal identification, harmonics extraction, and status reporting of transformer(s) along the fiber sensor route.

Data Acquisition

According to aspects of the present disclosure, distributed fiber optic sensing technology is used for real-time data acquisition and pre-processing. The distributed fiber optic sensing interrogator enables monitoring of all transformers along the entire fiber route at the same time—even while telecommunications traffic is traversing the fiber optic sensor fiber/cable.

Signal Processing Techniques

Transformer Identification

Using rolling window average for denoising the signal. Raw DFOS data is preprocessed and processed using various signal processing techniques such as windowing, filtering, and denoising.

Figure 5:
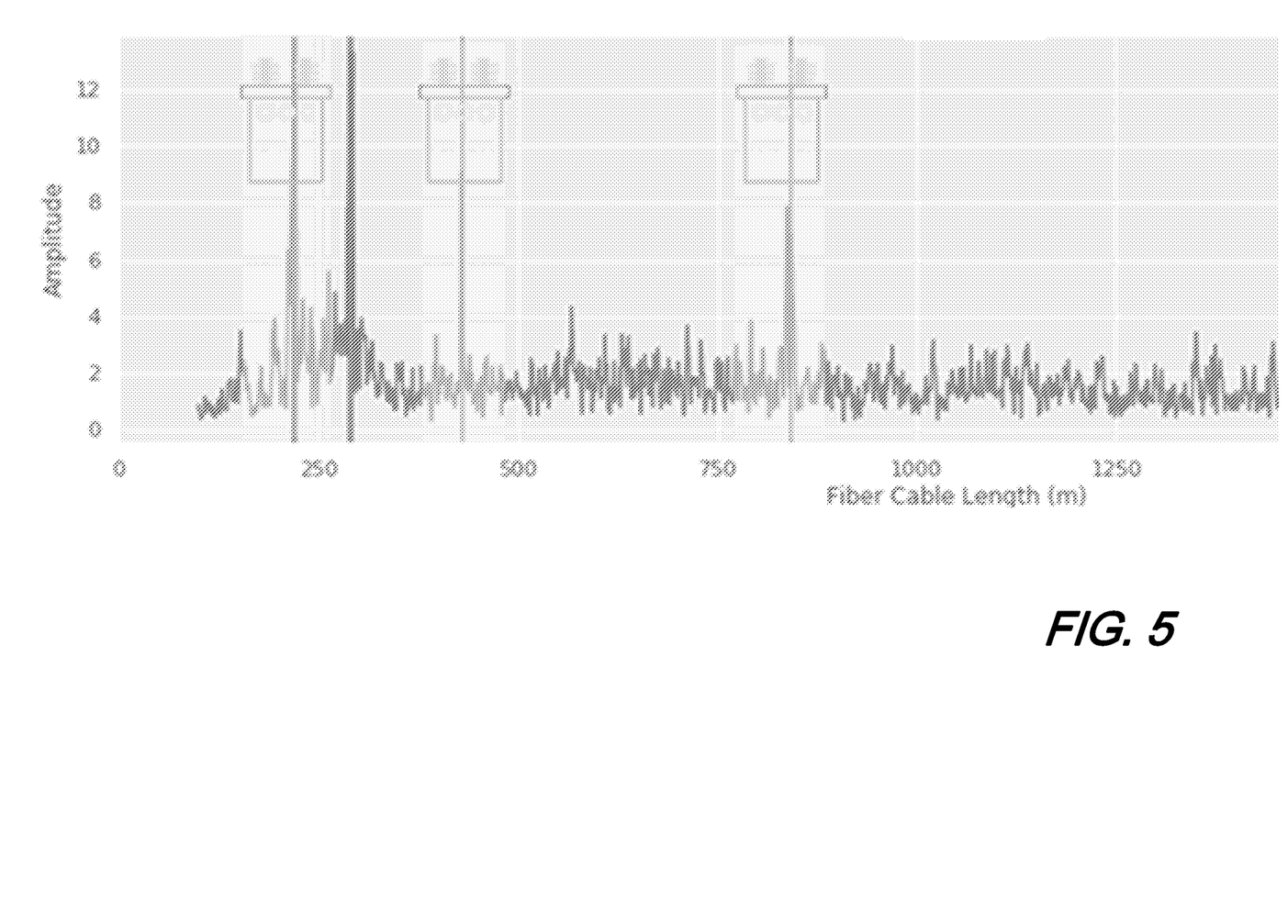
FIG. 5 is a plot illustrating electrical power distribution transformer signal (120 Hz) identification using Fast Fourier Transform (FFT) algorithm according to aspects of the present disclosure.

FIG. 5 is a plot illustrating electrical power distribution transformer signal (120 Hz) identification using Fast Fourier Transform (FFT) algorithm according to aspects of the present disclosure. As shown in that figure, a transformer humming signal (120 Hz) is detected from a fiber route having a total length of 2 km. In this illustrative route that produced the graph in the figure, there are three transformers mounted on three different poles. As will be appreciated, collected raw data may be very noisy which indicates that harmonics will be buried in the noise. In this case, the denoising algorithms are applied to the raw data and a rolling window average is applied to the raw data. By comparing the vibration level of the 120 Hz harmonic and noise level, we can identify poles with a transformer.

Uncertainty Quantification:

Those skilled in the art will understand and appreciate that humming originating from other electric power grid sources/equipment such as streetlights could be coupled to the signal thus give false identification of a transformer humming signal. In the example above, the false signal coming from other appliances is highlighted. As such, it is necessary to apply uncertainty quantification methods to the preliminary results.

Transformer loading status monitoring: once a pole with a transformer is identified and localized, the transformer status can be continuously monitored under different scenarios, such as different loading levels, number of harmonics, abnormal vibration levels, etc. Transformer signal strength may be detected and plotted at different load conditions to readily visualize such effect(s).

Figure 6:
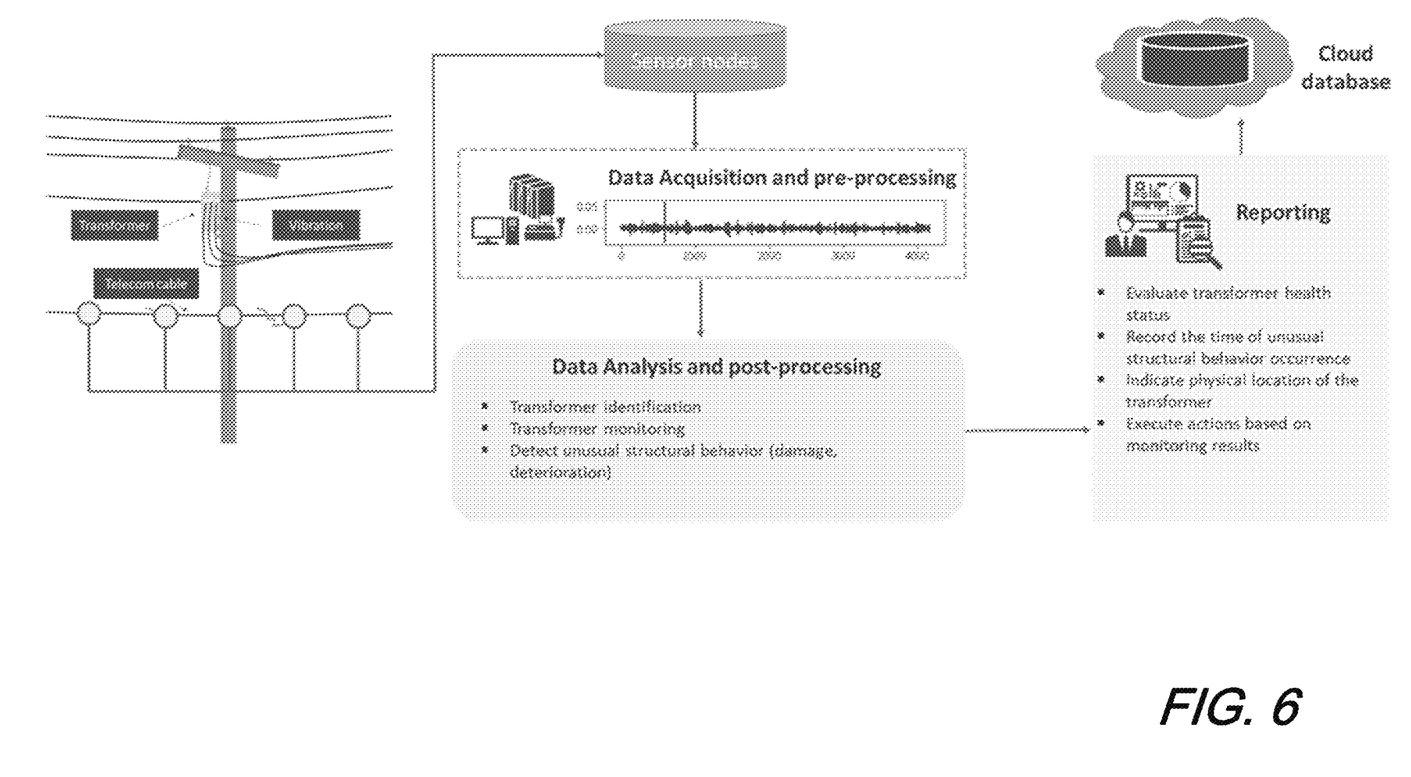
FIG. 6 is a schematic flow diagram illustrating overall process according to aspects of the present disclosure.

FIG. 6 is a schematic flow diagram illustrating overall process according to aspects of the present disclosure. Our inventive procedure may advantageously include a customized graphical user interface (GUI) to provide instant feedback on the operating status of transformers and provide quick localization of a transformer having performance/integrity issues. Operationally, functional operations of our inventive system may advantageously include evaluation of transformer health status, providing a record of time(s) of unusual structural behavior(s)/occurrence(s), and indication(s) of physical location of the transformer and execution of repair/maintenance tickets, etc.

Figure 7:
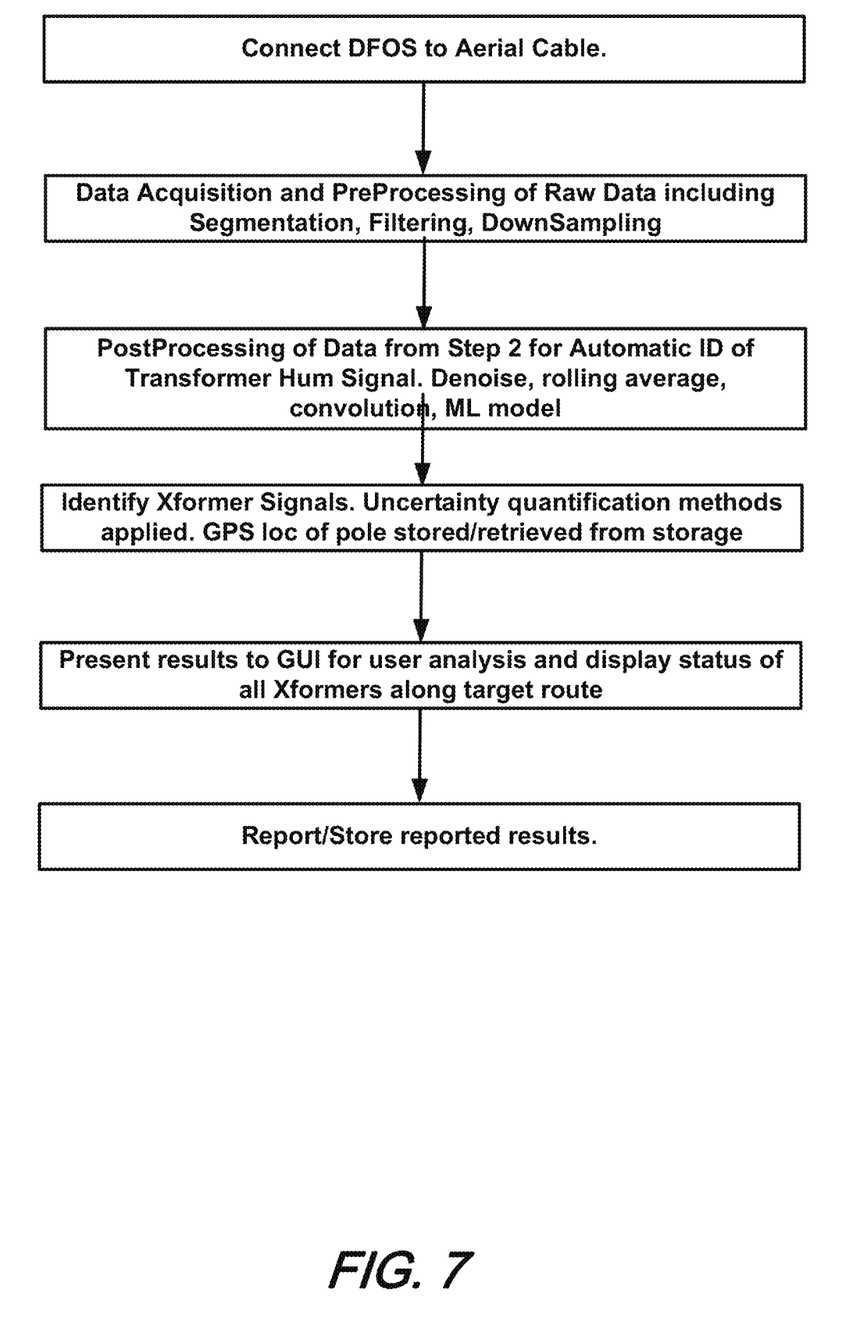
FIG. 7 is a flow diagram illustrating processing according to aspects of the present disclosure.

FIG. 7 is a flow diagram illustrating process according to aspects of the present disclosure. With reference to that figure, we note that Step 1 provides distributed fiber optic sensing interrogator/sensor setup and subsequent operational connection of the interrogator to a target fiber optic sensor route having a number of electrical transformers suspended on utility poles proximate to the sensor fiber.

Step 2 provides data acquisition and pre-processing of the raw DFOS data including segmentation, filtering, down sampling, etc.

Step 3 provides post-processing of data from Step 2 for automatic identification of a transformer humming signal (120 Hz). In this step the denoising algorithms such as rolling average, convolution, machine learning models, etc. can be applied to identify the humming signal (120 Hz).

Step 4 provides that when a transformer signal is identified, uncertainty quantification methods are applied to preliminary results for final verification, and a GPS location of affected pole(s) are retrieved a cloud or local database—as appropriate and/or convenient.

Step 5 transfers results from Step 4 to a GUI for evaluation by operators/users whereby such operators/users receive the current status of transformers along the target/monitored/sensed route.

Step 6 reports results and operators/users are provided with storage options of the data/results including local and/or cloud storage for immediate or future reference and analysis.

Figure 8:
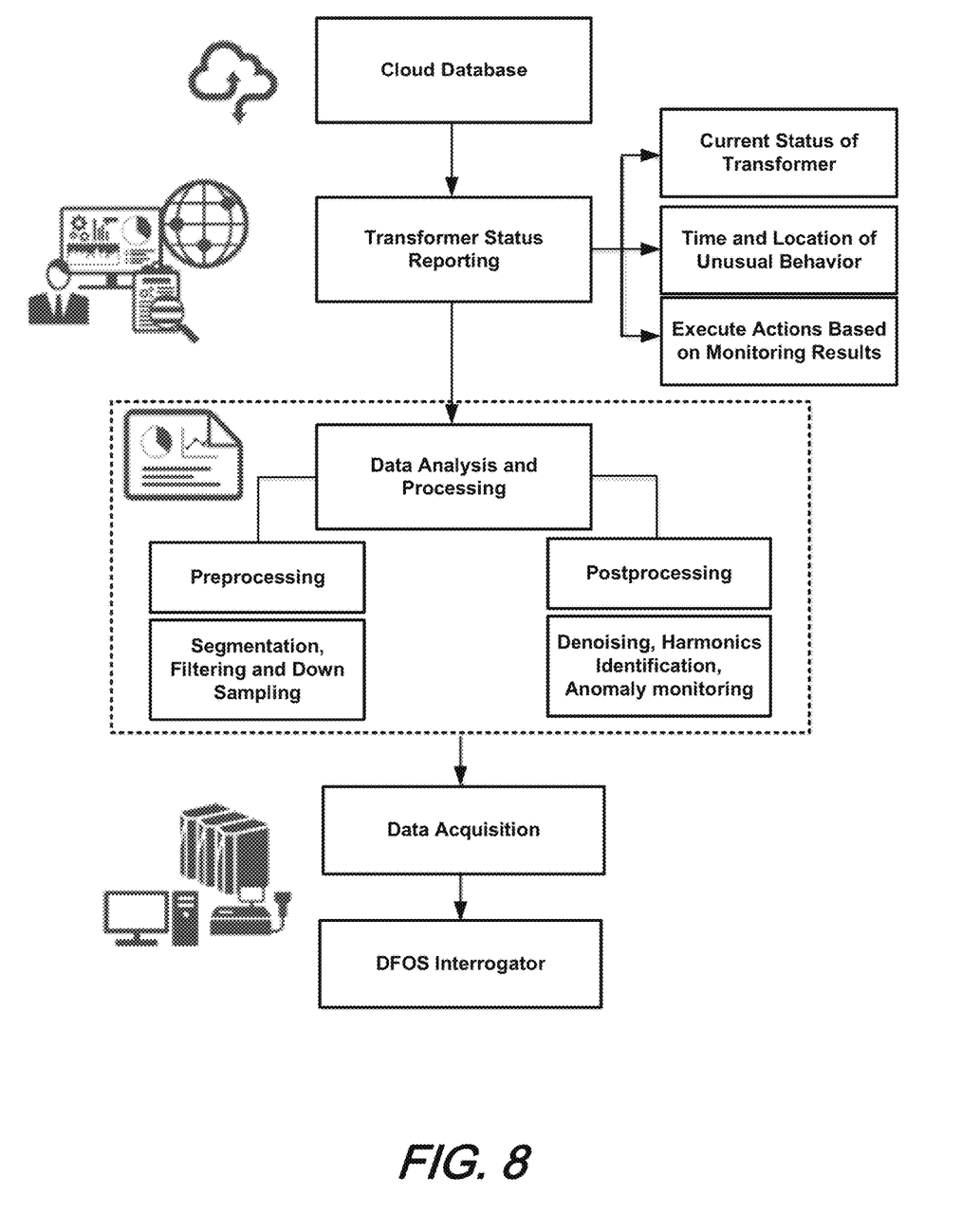
FIG. 8 is a schematic diagram illustrating features according to aspects of the present disclosure.

FIG. 8 is a schematic diagram illustrating operational features of systems/methods according to aspects of the present disclosure.

At this point, while we have presented this disclosure using some specific examples, those skilled in the art will recognize that our teachings are not so limited. Accordingly, this disclosure should be only limited by the scope of the claims attached hereto.

The invention claimed is:

1. An electrical power distribution transformer localization and monitoring method comprising:

providing a distributed fiber optic sensing system (DFOS), said system including a length of aerial optical sensor fiber, said aerial optical sensor fiber suspended from a plurality of utility poles, said aerial optical sensor fiber suspended from the utility poles independently from, and at a different location on the utility poles than any electrical power lines also suspended from the utility poles; and a DFOS interrogator and analyzer in optical communication with the length of optical fiber;

wherein one or more of the plurality of utility poles suspends, in addition to the aerial optical sensor fiber, an electrical power distribution transformer in electrical communication with at least one of the electrical power lines also suspended from the utility poles;

operating the DFOS system and simultaneously monitoring humming signal vibrations produced by all of the electrical power distribution transformers suspended on the or more of the plurality of utility poles, pre-processing humming signal vibration data using techniques including windowing, filtering, and denoising, and identifying individual utility poles of the plurality of utility poles suspending an electrical power distribution transformer from the pre-processed humming signal vibration data detected from DFOS signals received during operation; and continuously operating the DFOS system and detecting/identifying a malfunctioning distribution transformer from humming signal(s) as compared with humming signal(s) previously detected, wherein the monitored humming signal vibrations are detected at a point of the optical sensor fiber where it is suspended from the utility poles.

2. The method of claim 1 further comprising determining a GPS location of the utility pole and suspended malfunctioning distribution transformer.

3. The method of claim 2 further comprising dispatching repair/maintenance operations to the malfunctioning distribution transformer location.

4. The method of claim 3 wherein said dispatching repair/maintenance operations is performed in response to indicia provided by a graphical user interface of a monitoring/reporting system in response to the detection/identification of the malfunctioning distribution transformer.

5. The method of claim 1 further comprising detecting/identifying a malfunctioning distribution transformer from 120 Hz harmonic humming signal(s) as compared with humming signal(s) previously detected.

6. The method of claim 5 further comprising quantifying uncertainty resulting from humming vibrations produced by other electric power grid equipment including street lights, wherein the humming vibrations produced by the other electric power grid equipment is coupled to humming signals from the distribution transformers.

7. The method of claim 6 wherein the continuous monitoring incudes monitoring the distribution transformers at different scenarios selected from the group consisting of loading level, number of harmonics, and abnormal vibration.

* * * * *